(12) United States Patent
Jang (10) Patent No.: US 10,896,910 B2
(45) Date of Patent: Jan. 19, 2021

(54) MEMORY STRUCTURE AND MANUFACTURING METHOD THEREOF

(71) Applicant: Powerchip Semiconductor Manufacturing Corporation, Hsinchu (TW)

(72) Inventor: Wen-Yueh Jang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 59 days.

(21) Appl. No.: 16/364,207

(22) Filed: Mar. 26, 2019

(65) Prior Publication Data
US 2020/0251480 A1    Aug. 6, 2020

(30) Foreign Application Priority Data

Feb. 1, 2019    (TW) .............................. 108104152 A (51) Int. Cl.
| | |
|---|---|
| H01L 21/66 | (2006.01) |
| H01L 27/11521 | (2017.01) |
| H01L 29/788 | (2006.01) |
| H01L 27/11558 | (2017.01) |
| H01L 27/11519 | (2017.01) |

(52) U.S. Cl.
CPC .. *H01L 27/11521* (2013.01); *H01L 27/11519* (2013.01); *H01L 27/11558* (2013.01); *H01L 29/788* (2013.01)

(58) Field of Classification Search
None
See application file for complete search history.

(56) References Cited

U.S. PATENT DOCUMENTS

| | | | |
|---|---|---|---|
| 6,245,614 B1 | 6/2001 | Hsieh | |
| 8,669,607 B1 * | 3/2014 | Tsair | .................. H01L 29/7881 257/316 |

(Continued)

FOREIGN PATENT DOCUMENTS

| | | |
|---|---|---|
| CN | 109148455 | 1/2019 |
| CN | 109192729 | 1/2019 |

(Continued)

OTHER PUBLICATIONS

"Office Action of Taiwan Counterpart Application", dated Jul. 8, 2019, p. 1-p. 4.

*Primary Examiner* — Ali Naraghi
(74) *Attorney, Agent, or Firm* — JCIPRNET (57) ABSTRACT

A memory structure and a manufacturing method thereof are provided. In the memory structure, a first dielectric layer is disposed on a substrate; a pair of gate stack structures is disposed on the first dielectric layer and each gate stack structure includes a word line, an erase gate and a second dielectric layer; a third dielectric layer is disposed on the surfaces of the gate stack structures; a pair of floating gates is disposed between the gate stack structures and located respectively on sidewalls of the gate stack structures, and top surfaces of the floating gates are lower than those of the erase gates; a fourth dielectric layer covers the first and third dielectric layers and the floating gates; a control gate is disposed on the fourth dielectric layer between the floating gates; and a doped region is disposed in the substrate beside the gate stack structures.

10 Claims, 7 Drawing Sheets

(56) References Cited

U.S. PATENT DOCUMENTS

| | | | |
|---|---|---|---|
| 9,559,177 B2* | 1/2017 | Wu | H01L 21/31116 |
| 10,170,488 B1 | 1/2019 | Shu et al. | |
| 2017/0345835 A1* | 11/2017 | Liu | H01L 27/1052 |
| 2018/0019251 A1* | 1/2018 | Tsao | H01L 29/40114 |
| 2018/0108665 A1 | 4/2018 | Hayakawa et al. | |
| 2019/0006397 A1 | 1/2019 | Yamazaki et al. | |
| 2019/0088561 A1* | 3/2019 | Lin | H01L 27/11529 |

FOREIGN PATENT DOCUMENTS

| | | |
|---|---|---|
| JP | 2018170444 | 11/2018 |
| TW | 201810625 | 3/2018 |
| TW | 201839961 | 11/2018 |
| TW | I645546 | 12/2018 |

* cited by examiner

MEMORY STRUCTURE AND MANUFACTURING METHOD THEREOF

CROSS-REFERENCE TO RELATED APPLICATION

This application claims the priority benefit of Taiwan application serial no. 108104152, filed on Feb. 1, 2019. The entirety of the above-mentioned patent application is hereby incorporated by reference herein and made a part of this specification.

BACKGROUND

Technical Field

The present invention relates to a semiconductor structure and a manufacturing method thereof, and more particularly to a memory structure and a manufacturing method thereof.

Description of Related Art

A non-volatile memory can perform operations such as storing, reading and erasing multiple data, and the stored data does not disappear when the power supply is interrupted. Besides, the data access time is short and the power consumption is low. As a result, a non-volatile memory is widely used in personal computers and electronic devices.

In the current trend of increasing element integration, how to increase the memory reading speed and erasing speed without increasing the size of the memory cell has become a consistent goal in the industry.

SUMMARY

The present invention provides a memory structure that increases the erasing speed without increasing the size of the memory cell.

The present invention provides a manufacturing method of the memory structure described above.

A memory structure of the present invention includes a first dielectric layer, a pair of gate stack structures, a third dielectric layer, a pair of floating gates, a fourth dielectric layer, a control gate, and a doped region. The first dielectric layer is disposed on a substrate. The pair of gate stack structures is disposed on the first dielectric layer and separated from each other. Each of the gate stack structures includes a word line, an erase gate, and a second dielectric layer. The word line is disposed on the substrate. The erase gate is disposed on the word line. The second dielectric layer is disposed between the word line and the erase gate. The third dielectric layer is disposed on a surface of each of the gate stack structures. The pair of floating gates is disposed between the gate stack structures, wherein each of the floating gates is located on the third dielectric layer on a sidewall of the corresponding gate stack structure. The top surfaces of the floating gates are lower than the top surfaces of the erase gates. The fourth dielectric layer covers the first dielectric layer, the third dielectric layer, and the floating gates. The control gate is disposed on the fourth dielectric layer between the floating gates. The doped region is disposed in the substrate beside each of the gate stack structures.

In an embodiment of the memory structure of the present invention, the top surface of each of the floating gates is, for example, higher than the bottom surface of each of the erase gates.

In an embodiment of the memory structure of the present invention, the top surface of the control gate is, for example, lower than the top surface of each of the floating gates.

In an embodiment of the memory structure of the present invention, the doped region between the floating gates is located, for example, under the control gate.

In an embodiment of the memory structure of the present invention, each of the floating gates has, for example, a form of a spacer.

A manufacturing method of a memory structure of the present invention includes the steps of: forming a first dielectric layer on a substrate; forming a pair of separate gate stack structures on the first dielectric layer, wherein each of the gate stack structures includes a word line, an erase gate, and a second dielectric layer, the word line is located on the substrate, the erase gate is located on the word line, and the second dielectric layer is located between the word line and the erase gate; forming a third dielectric layer on a surface of each of the gate stack structures; forming a pair of floating gates between the gate stack structures, wherein each of the floating gates is located on the third dielectric layer on a sidewall of the corresponding gate stack structure, and a top surface of each of the floating gates is lower than a top surface of each of the erase gates; forming a doped region in the substrate beside each of the gate stack structures; forming a fourth dielectric layer on the substrate, wherein the fourth dielectric layer covers the first dielectric layer, the third dielectric layer and the floating gates; forming a control gate on the fourth dielectric layer between the floating gates.

In an embodiment of the manufacturing method of the memory structure of the present invention, the top surface of each of the floating gates is, for example, higher than the bottom surface of each of the erase gates.

In an embodiment of the manufacturing method of the memory structure of the present invention, the top surface of the control gate is, for example, lower than the top surface of each of the floating gates.

In an embodiment of the manufacturing method of the memory structure of the present invention, the method of forming the pair of floating gates includes the steps of: conformally forming a floating gate material layer on the substrate, wherein the floating gate material layer covers the gate stack structures; performing an anisotropic etching process to remove a portion of the floating gate material layer and therefore form spacers until top surfaces of the spacers are lower than top surfaces of the erase gates; and removing the spacers outside the pair of gate stack structures.

In an embodiment of the manufacturing method of the memory structure of the present invention, the method of forming the control gate includes the steps of: forming a control gate material layer on the fourth dielectric layer, wherein the control gate material layer fills the space between the gate stack structures; performing an etch back process to remove a portion of the control gate material layer; and removing the control gate material layer outside the pair of gate stack structures.

A memory structure of the present invention includes a first dielectric layer, a pair of gate stack structures, a third dielectric layer, a pair of floating gates, a fourth dielectric layer, a control gate, a doped region, a fifth dielectric layer, and an erase gate. The first dielectric layer is disposed on the substrate. The pair of gate stack structures is disposed on the first dielectric layer and separated from each other. Each of the gate stack structures includes a word line and a second dielectric layer. The word line is disposed on the substrate. The second dielectric layer is disposed on the word line. The third dielectric layer is disposed on a sidewall of each of the gate stack structures. The pair of floating gates is disposed between the gate stack structures, wherein each of the floating gates is located on the third dielectric layer on the sidewall of the corresponding gate stack structure, and the top surface of each of the floating gates is not higher than the top surface of the second dielectric layer. The fourth dielectric layer covers the first dielectric layer, the third dielectric layer, and the floating gates. The control gate is disposed on the fourth dielectric layer between the floating gates. The doped region is disposed in the substrate beside each of the gate stack structures. The fifth dielectric layer covers the gate stack structures, the third dielectric layer, the floating gates, the fourth dielectric layer, and the control gate. The erase gate is disposed on the fifth dielectric layer and located above the control gate and the pair of floating gates.

In an embodiment of the memory structure of the present invention, the top surface of the control gate is, for example, lower than the top surface of each of the floating gates.

In an embodiment of the memory structure of the present invention, the erase gate is, for example, overlapped with the pair of floating gates and the pair of gate stack structures.

In an embodiment of the memory structure of the present invention, the doped region between the floating gates is located, for example, under the control gate.

In an embodiment of the memory structure of the present invention, each of the floating gates has, for example, a form of a spacer.

A manufacturing method of a memory structure of the present invention includes the steps of: forming a first dielectric layer on a substrate; forming a pair of separate gate stack structures on the first dielectric layer, wherein each of the gate stack structures includes a word line and a second dielectric layer, the word line is located on the substrate, and the second dielectric layer is located on the word line; forming a third dielectric layer on a surface of each of the gate stack structures; forming a pair of floating gates between the gate stack structures, wherein each of the floating gates is located on the third dielectric layer on a sidewall of the corresponding gate stack structure, and a top surface of each of the floating gates is not higher than a top surface of the second dielectric layer; forming a doped region in the substrate beside each of the gate stack structures; forming a fourth dielectric layer on the substrate, wherein the fourth dielectric layer covers the first dielectric layer, the third dielectric layer and the floating gates; forming a control gate on the fourth dielectric layer between the floating gates; forming a fifth dielectric layer on the substrate, wherein the fifth dielectric layer covers the gate stack structures, the third dielectric layer, the floating gates, the fourth dielectric layer and the control gate; and forming an erase gate on the fifth dielectric layer, wherein the erase gate is located above the control gate and the pair of floating gates.

In an embodiment of the manufacturing method of the memory structure of the present invention, the top surface of the control gate is, for example, lower than the top surface of each of the floating gates.

In an embodiment of the manufacturing method of the memory structure of the present invention, the erase gate is overlapped with the pair of floating gates and the pair of gate stack structures.

In an embodiment of the manufacturing method of the memory structure of the present invention, the method of forming the pair of floating gates includes the steps of: conformally forming a floating gate material layer on the substrate, wherein the floating gate material layer covers the gate stack structures; performing an anisotropic etching process to remove a portion of the floating gate material layer and therefore form spacers until top surfaces of the spacers are not higher than top surfaces of the second dielectric layers; and removing the spacers outside of the pair of gate stack structures.

In an embodiment of the manufacturing method of the memory structure of the present invention, the method of forming the control gate includes the steps of: forming a control gate material layer on the fourth dielectric layer, wherein the control gate material layer fills the space between the gate stack structures; performing an etch back process to remove a portion of the control gate material layer; and removing the control gate material layer outside the pair of gate stack structures.

Based on the above, the memory structure of the present invention has a pair of memory cells, and the two memory cells share a control gate and a doped region therebetween, so that the size of the memory structure can be effectively reduced, and the two memory cells can be separately operated according to actual needs. In addition, in each of the memory cells, the floating gate is arranged in the form of a spacer. By such disposition, electrons can rapidly move from the top (vertex) of the floating gate to the erase gate during an erasing operation, and the erasing speed can be effectively increased. In addition, since the top surface of the control gate is lower than the top surface of the floating gate, it is possible to avoid a breakdown between the control gate and the erase gate during an erasing operation of the memory cell.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The embodiments are described in detail below with reference to the accompanying drawings, but the embodiments are not intended to limit the scope of the invention. In addition, the drawings are for illustrative purposes only and are not drawn to the original dimensions. For the sake of easy understanding, the same elements in the following description will be denoted same reference numerals.

In addition, the terms mentioned in the text, such as "comprising", "including" and "having" are all open-ended terms, i.e., meaning "including but not limited to".

In addition, the directional terms mentioned in the text, such as "on" and "under", are merely used to refer to the drawings and are not intended to limit the invention.

First Embodiment

FIGS. 1A to 1E are schematic cross-sectional views showing a manufacturing process of a memory structure in accordance with a first embodiment of the present invention.

Figure 1A:
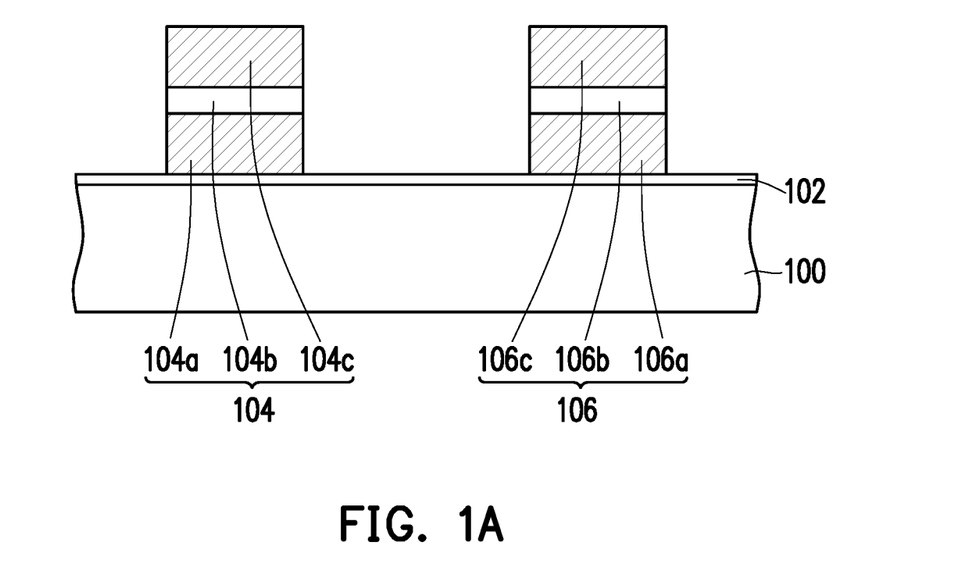
FIGS. 1A to 1E are schematic cross-sectional views showing a manufacturing process of a memory structure in accordance with a first embodiment of the present invention.

Referring to FIG. 1A, a substrate 100 is provided. The substrate 100 can be a semiconductor substrate, such as a silicon substrate. Next, a dielectric layer 102 is formed on the substrate 100. In the present embodiment, the material of the dielectric layer 102 is, for example, silicon oxide, and the formation method thereof is, for example, a thermal oxidation method. The dielectric layer 102 can serve as a gate dielectric layer in the memory structure of the present invention. Then, a pair of gate stack structures, namely a gate stack structure 104 and a gate stack structure 106, is formed on the dielectric layer 102. The gate stack structure 104 and the gate stack structure 106 are separated from each other. The gate stack structure 104 includes a word line 104a, a dielectric layer 104b, and an erase gate 104c that are sequentially stacked on the substrate 100. In addition, the gate stack structure 106 includes a word line 106a, a dielectric layer 106b, and an erase gate 106c that are sequentially stacked on the substrate 100. In the present embodiment, the material of the word line 104a, the erase gate 104c, the word line 106a, and the erase gate 106c is, for example, polysilicon, and the material of the dielectric layer 104b and the dielectric layer 106b is, for example, silicon oxide. In other embodiments, a cap layer may also be selectively formed on the erase gate 104c and the erase gate 106c. The material of the cap layer is, for example, silicon nitride. In this embodiment, the method of forming the word line 104a, the dielectric layer 104b, the erase gate 104c, the word line 10a, the dielectric layer 106b, and the erase gate 106c includes, for example, forming a word line material layer, a dielectric material layer and an erase gate material layer sequentially on the substrate 100, and then performing a patterning process.

Figure 1B:
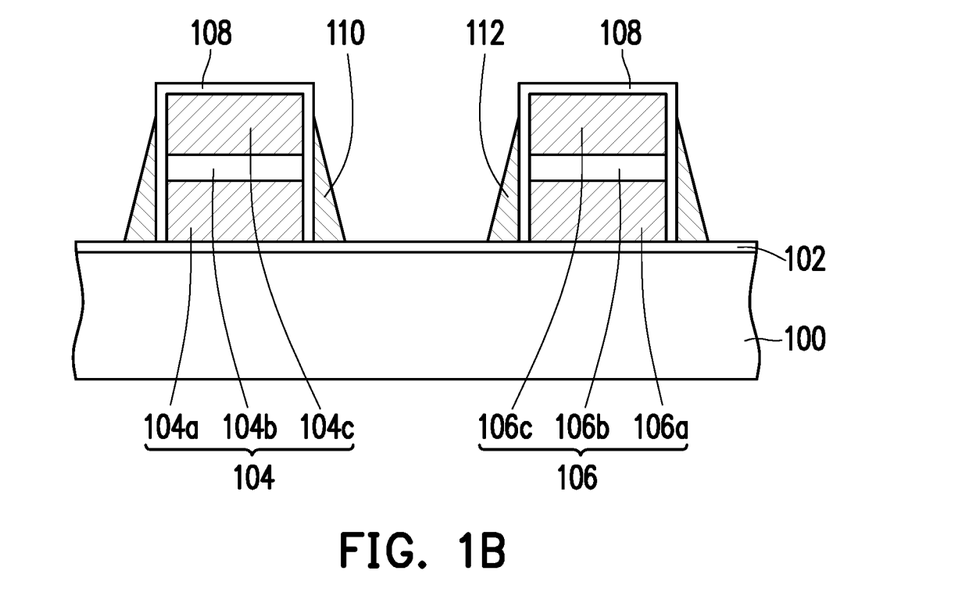

Next, referring to FIG. 1B, a dielectric layer 108 is formed on the surface of the gate stack structure 104 and on the surface of the gate stack structure 106. The material of the dielectric layer 108 has a high etch selectivity relative to silicon. In the present embodiment, the material of the dielectric layer 108 is, for example, silicon oxide. The dielectric layer 108 is used to protect the gate stack structure 104 and the gate stack structure 106 from being damaged during the subsequent processes. Then, spacers 110 are formed on the dielectric layer 108 on the sidewalls of the gate stack structure 104, and spacers 112 are formed on the dielectric layer 108 on the sidewalls of the gate stack structure 106. In the present embodiment, the material of the spacers 110 and the spacers 112 is, for example, polysilicon. The method of forming the spacers 110 and the spacers 112 includes, for example, conformally forming a space material layer on the substrate 100, and then performing an anisotropic etching process to remove a portion of the spacer material layer until the dielectric layer 108 on the gate stack structure 104 and the gate stack structure 106 is exposed.

In the above anisotropic etching process, after the dielectric layer 108 on the gate stack structure 104 and the gate stack structure 106 is exposed, the etching process is continued for a period, until the top surfaces of the formed spacers 110 and spacers 112 are lower than the top surfaces of the erase gate 104c and the erase gate 106c. In the present embodiment, after the anisotropic etching process is performed, the top surfaces (vertices) of the formed spacers 110 are lower than the top surface of the erase gate 104c and higher than the bottom surface of the erase gate 104c. In addition, after the anisotropic etching process, the top surfaces (vertices) of the formed spacers 112 are lower than the top surface of the erase gate 106c and higher than the bottom surface of the erase gate 106c.

Figure 1C:
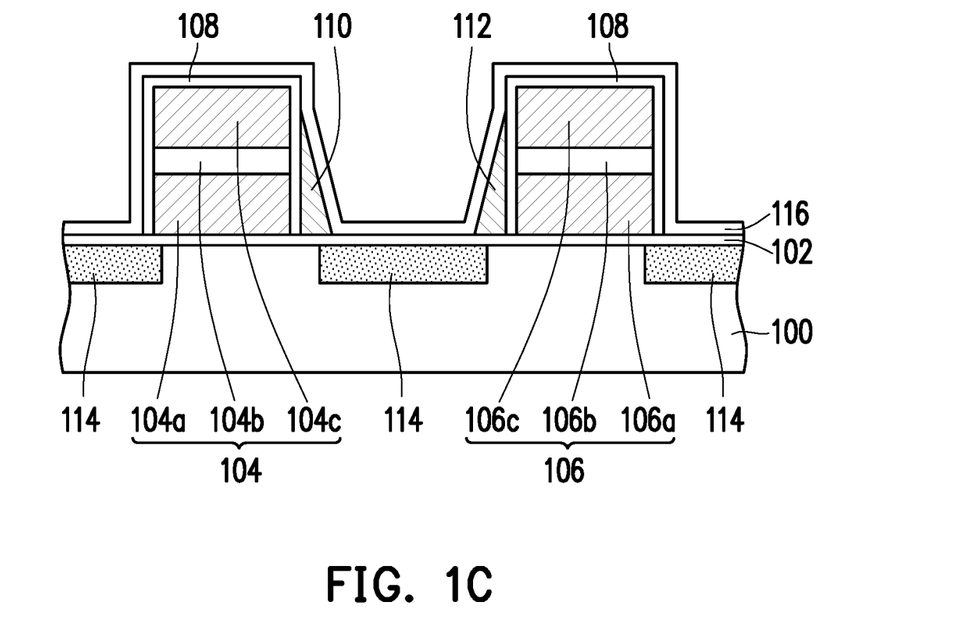

Then, referring to FIG. 1C, the spacers outside the gate stack structure 104 and the gate stack structure 106 are removed, and the spacers between the gate stack structure 104 and the gate stack structure 106 are retained. In detail, in this step, the spacer 110 on the left side of the gate stack structure 104 and the spacer 112 on the right side of the gate stack structure 106 are removed. The method of removing the spacers includes, for example, forming a patterned mask layer exposing the spacers outside the gate stack structure 104 and the gate stack structure 106 on the substrate 100, and then performing an etching process to remove the exposed spacers. In the present embodiment, the spacer 110 and the spacer 112 remaining between the gate stack structure 104 and the gate stack structure 106 can serve as floating gates in the memory structure of the present invention. Therefore, the spacer 110 and the spacer 112 may also be referred to as floating gate spacers.

After removing the spacers outside the gate stack structure 104 and the gate stack structure 106, a doped region is formed in the substrate 100 beside the gate stack structure 104 and the gate stack structure 106. In this embodiment, an ion implantation process is performed by using the gate stack structure 104, the spacer 110, the gate stack structure 106 and the spacer 112 as a mask. Doped region 114s are formed in the substrate 100 on the left side of the gate stack structure 104, on the right side of the gate stack structure 106, and between the spacer 110 and the spacer 112. The doped regions 114 may serve as source/drain regions in the memory structure of the present invention. Further, in the present embodiment, after the ion implantation process, the annealing process may be selectively performed to diffuse the dopant in the substrate 100. As shown in FIG. 1C, in the present embodiment, after the annealing process is performed, the doped region 114 on the left side of the gate stack structure 104 is diffused to a region under the gate stack structure 104, the doped region 114 on the right side of the gate stack structure 106 is diffused to a region under the gate stack structure 106, and the doped region 114 between the spacer 110 and the spacer 112 diffuses to a region under the spacer 110 and the spacer 112.

After forming the doped regions 114, a dielectric layer 116 is formed on the substrate 100. In the present embodiment, the dielectric layer 116 is conformally formed on the substrate 100 and covers the dielectric layer 102, the dielectric layer 108, the spacer 110, and the spacer 112. The material of dielectric layer 116 has a high etch selectivity relative to silicon. In this embodiment, the material of the dielectric layer 116 is, for example, silicon oxide, or the dielectric layer 116 may also be a composite dielectric layer composed of a silicon oxide layer, a silicon nitride layer, and a silicon oxide layer, i.e., a commonly known ONO composite dielectric layer.

Figure 1D:
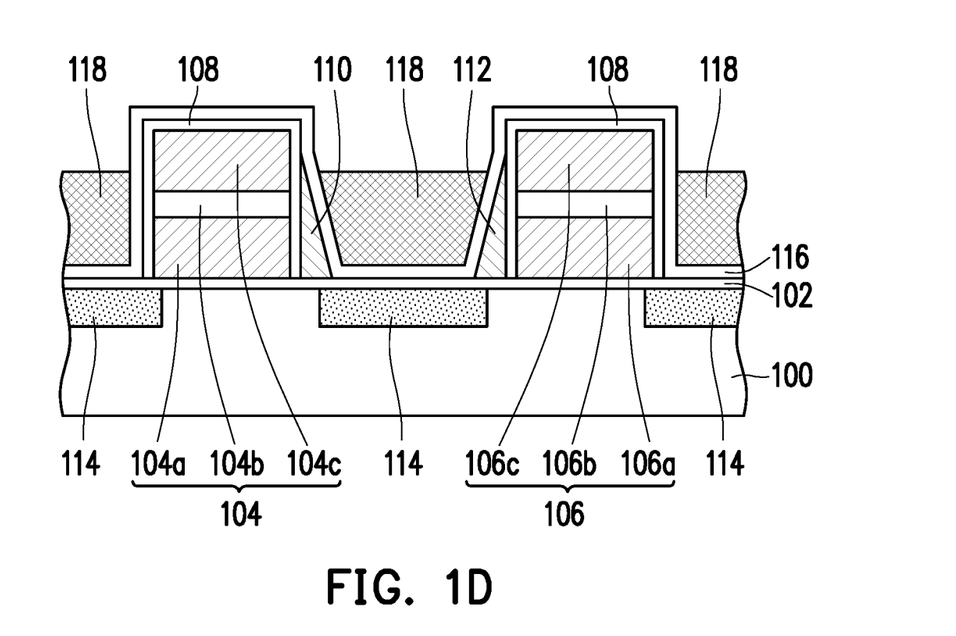

Next, referring to FIG. 1D, a control gate material layer 118 is formed on the dielectric layer 116. The material of the control gate material layer 118 is, for example, polysilicon. The control gate material layer 118 covers gate stack structure 104 and gate stack structure 106 and fills the space between gate stack structure 104 and gate stack structure 106. Then, an etch back process is performed to remove a portion of the control gate material layer 118, such that the top surface of the control gate material layer 118 is lower than the top surfaces (vertices) of the spacer 110 and the spacer 112.

Figure 1E:
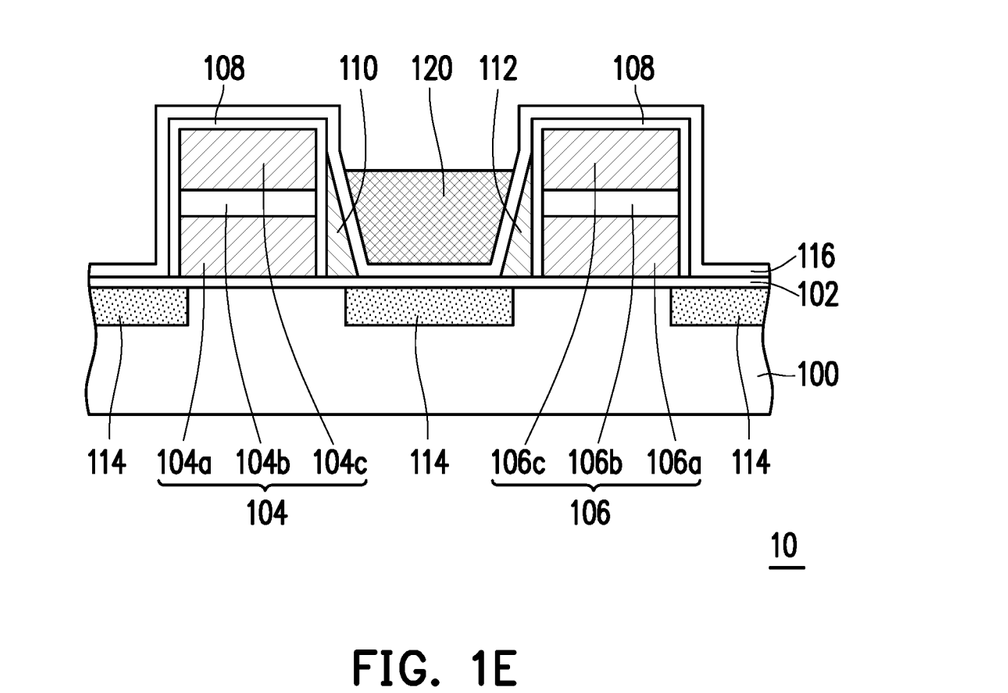

Thereafter, referring to FIG. 1E, the control gate material layer 118 outside the gate stack structure 104 and the gate stack structure 106 is removed, and the control gate material layer 118 between the gate stack structure 104 and the gate stack structure 106 is retained. In detail, in this step, the control gate material layer 118 on the left side of the gate stack structure 104 and on the right side of the gate stack structure 106 is removed. The method of removing the control gate material layer 118 includes, for example, forming a patterned mask layer that exposes the control gate material layer 118 outside the gate stack structure 104 and the gate stack structure 106 on the substrate 100, and then performing an etching process to remove the exposed control gate material layer 118. In the present embodiment, the control gate material layer 118 remaining between the gate stack structure 104 and the gate stack structure 106 forms a control gate 120 in the memory structure of the present invention. In this way, the manufacture of the memory structure 10 of the present embodiment is completed.

The memory structure of the present invention will be further described below with the memory structure 10 of FIG. 1E.

Referring to FIG. 1E, in the memory structure 10, the gate stack structure 104 and the gate stack structure 106 are disposed on the dielectric layer 102 and are separated from each other. The gate stack structure 104 includes a word line 104a, a dielectric layer 104b, and an erase gate 104c which are sequentially stacked on the substrate 100, and the gate stack structure 106 includes a word line 106a, a dielectric layer 106b, and an erase gate 106c which are sequentially stacked on the substrate 100. The spacer 110 and the spacer 112 as floating gates are disposed between the gate stack structure 104 and the gate stack structure 106, and the top surfaces of the spacer 110 and the spacer 112 are lower than the top surfaces of the erase gate 104c and the erase gate 106c. The control gate 120 is disposed between the spacer 110 and the spacer 112.

Therefore, the memory structure 10 can have a pair of memory cells. The memory cell on the left side includes a gate stack structure 104, a dielectric layer 108, a spacer 110 as a floating gate, doped regions 114 at both sides of the gate stack structure 104, a dielectric layer 116, and a control gate 120. The memory cell on the right side includes a gate stack structure 106, a dielectric layer 108, a spacer 112 as a floating gate, doped regions 114 at both sides of the gate stack structure 106, a dielectric layer 116, and a control gate 120. The memory cell on the left side and the memory cell on the right side share the control gate 120 and the doped region 114 therebetween, so that the size of the memory structure can be effectively reduced, and the two memory cells can be operated separately according to actual needs.

In each memory cell, the floating gate has a spacer form (spacer 110 or spacer 112), and the top surface of the floating gate is lower than the top surface of the erase gate and higher than the bottom surface of the erase gate. During the erasing operation of the memory cell, the electrons can rapidly move from the top (vertex) of the floating gate to the erase gate, thereby effectively increasing the erasing speed. In addition, the top surface of the control gate 120 is lower than the top surface of the floating gate, thereby avoiding a breakdown between the control gate and the erase gate during the erasing operation of the memory cell.

The method of operating the memory structure of the present invention will be briefly described below.

In one embodiment, when the memory structure 10 of the present invention is programmed, a voltage of 0.6 V is applied to the word line 104a and the word line 106a, a voltage of 8 V is applied to the control gate 120, a voltage of 4 V is applied to the doped region 114 as a source, a voltage of 4 V is applied to the erase gate 104c and the erase gate 106c, and zero voltage is applied to the doped region 114 as a drain and the substrate 100. At this point, electrons are injected from the drain to the floating gate for source-side injection.

In an embodiment, when the memory structure 10 of the present invention is erased, a voltage of −8 V is applied to the control gate 120, the doped region 114 as a source and a drain is floated, a voltage of 8 V is applied to the erase gate 104c and the erase gate 106c, and zero voltage is applied to the word line 104a, the word line 106a and the substrate 100. At this point, electrons move rapidly from the top surface (vertex) of the floating gate to the erase gate for F-N tunneling.

Second Embodiment

FIGS. 2A to 2G are schematic cross-sectional views showing a manufacturing process of a memory structure in accordance with a second embodiment of the present invention.

Figure 2A:
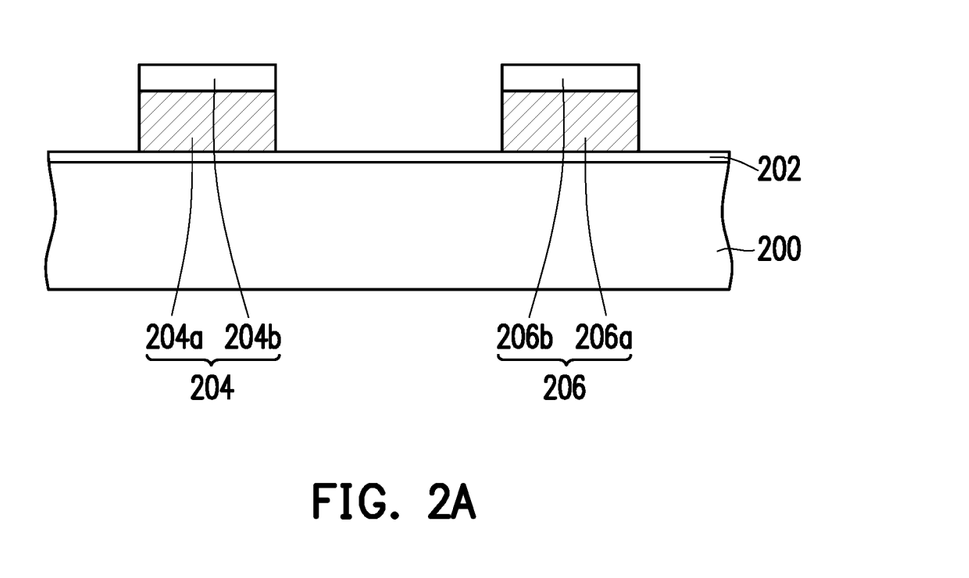
FIGS. 2A to 2G are schematic cross-sectional views showing a manufacturing process of a memory structure in accordance with a second embodiment of the present invention.

Referring to FIG. 2A, a substrate 200 is provided. The substrate 200 can be a semiconductor substrate, such as a silicon substrate. Next, a dielectric layer 202 is formed on the substrate 200. In the present embodiment, the material of the dielectric layer 202 is, for example, silicon oxide, and the formation method thereof is, for example, a thermal oxidation method. The dielectric layer 202 can serve as a gate dielectric layer in the memory structure of the present invention. Then, a pair of gate stack structures, namely a gate stack structure 204 and a gate stack structure 206, is formed on the dielectric layer 202. The gate stack structure 204 and the gate stack structure 206 are separated from each other. The gate stack structure 204 includes a word line 204a and a dielectric layer 204b which are sequentially stacked on the substrate 200. In addition, the gate stack structure 206 includes a word line 206a and a dielectric layer 206b that are sequentially stacked on the substrate 200. In the present embodiment, the material of the word line 204a and the word line 206a is, for example, polysilicon, and the material of the dielectric layer 204b and the dielectric layer 206b is, for example, silicon oxide. In this embodiment, the method of forming the word line 204a, the dielectric layer 204b, the word line 206a, and the dielectric layer 206b includes, for example, forming a word line material layer and a dielectric material layer sequentially on the substrate 200, and then performing a patterning process.

Figure 2B:
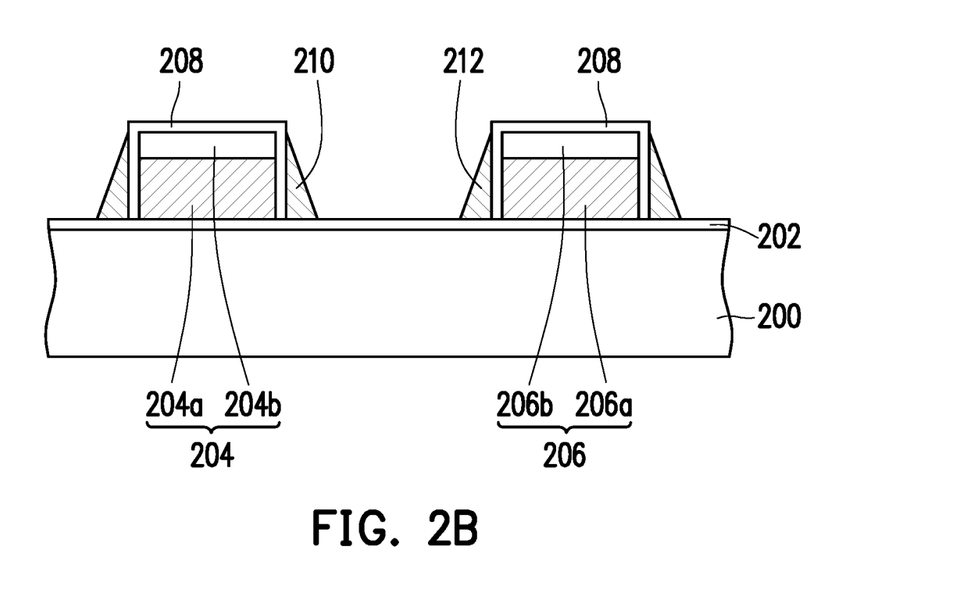

Next, referring to FIG. 2B, a dielectric layer 208 is formed on the surface of the gate stack structure 204 and on the surface of the gate stack structure 206. The material of dielectric layer 208 has a high etch selectivity relative to silicon. In the present embodiment, the material of the dielectric layer 208 is, for example, silicon oxide. The dielectric layer 208 is used to protect the gate stack structure 204 and the gate stack structure 206 from being damaged during the subsequent processes. Then, spacers 210 are formed on the dielectric layer 208 on the sidewalls of the gate stack structure 204, and spacers 212 are formed on the dielectric layer 208 on the sidewalls of the gate stack structure 206. In the present embodiment, the material of the spacers 210 and the spacers 212 is, for example, polysilicon. The method of forming the spacers 210 and the spacers 212 includes, for example, conformally forming a spacer material layer on the substrate 200, and then performing an anisotropic etching process to remove a portion of the spacer material layer until the dielectric layer 208 on the gate stack structure 204 and the gate stack structure 206 is exposed.

In the above anisotropic etching process, after the dielectric layer 208 on the gate stack structure 204 and the gate stack structure 206 is exposed, the etching process is continued for a period, until the top surfaces of the formed spacers 210 and the formed spacers 212 are at least no higher than the top surfaces of the dielectric layer 204b and the dielectric layer 206b. That is, the top surfaces of the formed spacers 210 and the formed spacers 212 may be equal to the top surfaces of the dielectric layer 204b and the dielectric layer 206b, or lower than the top surfaces of the dielectric layer 204b and the dielectric layer 206b. In the present embodiment, after the anisotropic etching process is performed, the top surfaces (vertice) of the formed spacers 210 are equal to the top surface of the dielectric layer 204b and higher than the bottom surface of the dielectric layer 204b. In addition, after the anisotropic etching process, the top surfaces (vertice) of the formed spacers 212 are to be equal to the top surface of the dielectric layer 206b and higher than the bottom surface of the dielectric layer 206b.

Figure 2C:
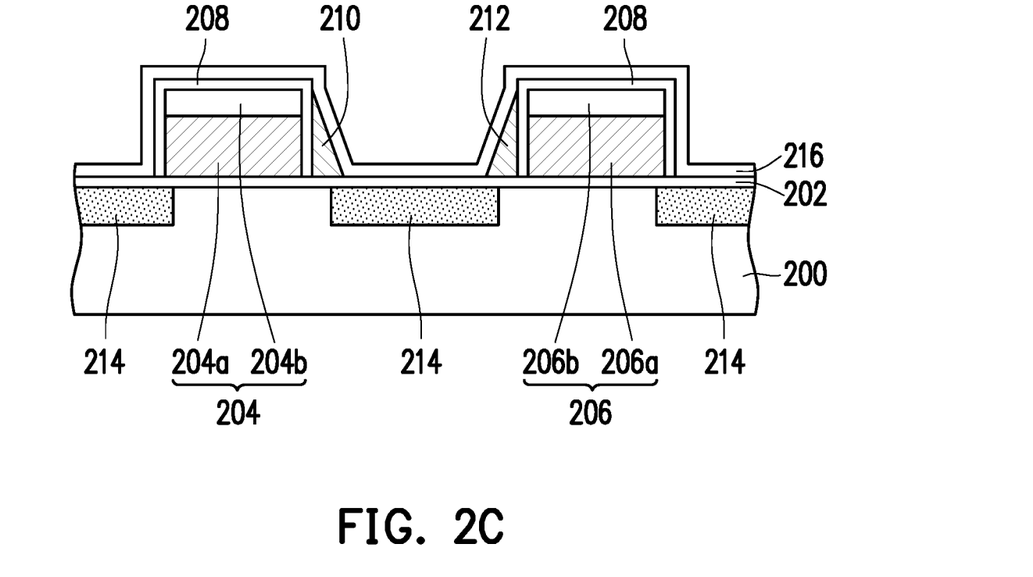

Then, referring to FIG. 2C, the spacers outside the gate stack structure 204 and the gate stack structure 206 are removed, and the spacers between the gate stack structure 204 and the gate stack structure 206 are retained. In detail, in this step, the spacer 210 on the left side of the gate stack structure 204 is removed, and the spacer 212 on the right side of the gate stack structure 206 is removed. The method of removing the spacers includes, for example, forming a patterned mask layer exposing the spacer outside the gate stack structure 204 and the gate stack structure 206 on the substrate 200, and then performing an etching process to remove the exposed spacers. In the present embodiment, the spacer 210 and the spacer 212 remaining between the gate stack structure 204 and the gate stack structure 206 can serve as floating gates in the memory structure of the present invention. Therefore, the spacer 210 and the spacer 212 may also be referred to as floating gate spacers.

After removing the spacers outside the gate stack structure 204 and the gate stack structure 206, a doped region is formed in the substrate 200 beside the gate stack structure 204 and the gate stack structure 206. In this embodiment, the ion implantation process is performed by using the gate stack structure 204, the spacer 210, the gate stack structure 206, and the spacer 212 as a mask. Doped regions 214 are formed in the substrate 200 on the left side of the gate stack structure 204, on the right side of the gate stack structure 206 and between the spacer 210 and the spacer 212. The doped regions 214 can serve as the source/drain regions in the memory structure of the present invention. Further, in the present embodiment, after an ion implantation process, the annealing process may be selectively performed to diffuse the dopant in the substrate 200. As shown in FIG. 2C, in the present embodiment, after the annealing process is performed, the doped region 214 on the left side of the gate stack structure 204 is diffused to a region under the gate stack structure 204, the doped region 214 on the right side of the gate stack structure 206 is diffused to a region under the gate stack structure 206, and the doped region 214 between the spacer 210 and the spacer 212 diffuses to a region under the spacer 210 and the spacer 212.

After the doped regions 214 are formed, a dielectric layer 216 is formed on the substrate 200. In the present embodiment, the dielectric layer 216 is conformally formed on the substrate 200 and covers the dielectric layer 202, the dielectric layer 208, the spacer 210, and the spacer 212. The material of dielectric layer 216 has a high etch selectivity relative to silicon. In this embodiment, the material of the dielectric layer 216 is, for example, silicon oxide, or the dielectric layer 216 may also be a composite dielectric layer composed of a silicon oxide layer, a silicon nitride layer and a silicon oxide layer, i.e., a well-known ONO composite dielectric layer.

Figure 2D:
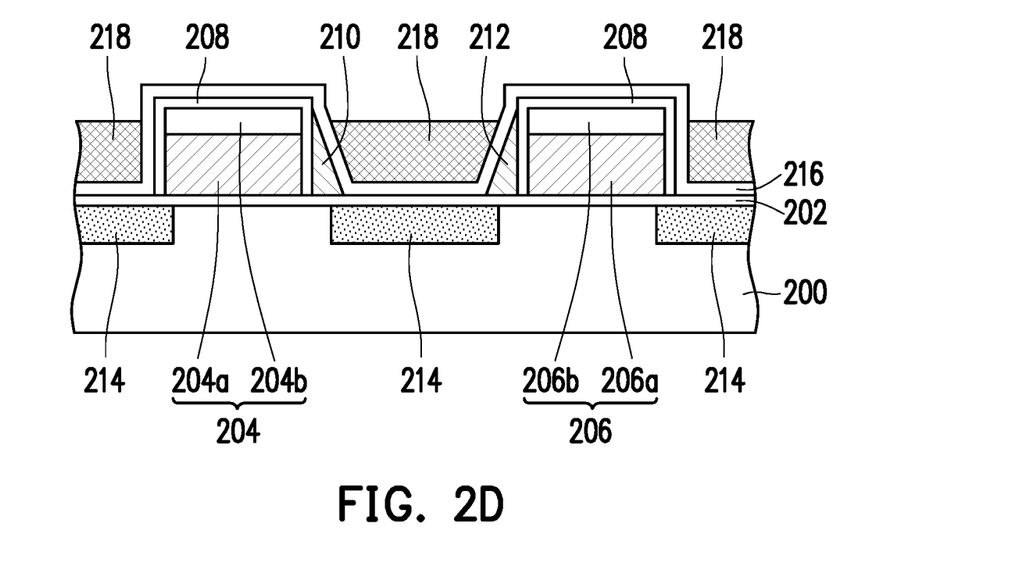

Next, referring to FIG. 2D, a control gate material layer 218 is formed on the dielectric layer 216. The material of the control gate material layer 218 is, for example, polysilicon. The control gate material layer 218 covers gate stack structure 204 and gate stack structure 206 and fills the space between gate stack structure 204 and gate stack structure 206. Then, an etch back process is performed to remove a portion of the control gate material layer 218, such that the top surface of the control gate material layer 218 is lower than the top surfaces (vertices) of the spacer 210 and the spacer 212.

Figure 2E:
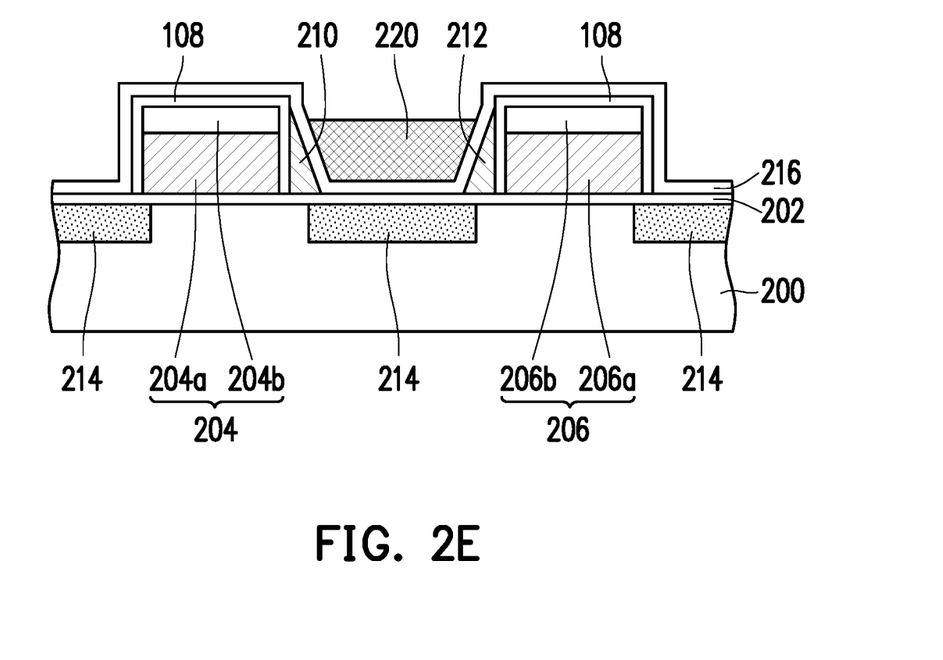

Then, referring to FIG. 2E, the control gate material layer 218 outside the gate stack structure 204 and the gate stack structure 206 is removed, and the control gate material layer 218 between the gate stack structure 204 and the gate stack structure 206 is retained. In detail, in this step, the control gate material layer 218 on the left side of the gate stack structure 204 is removed, and the control gate material layer 218 on the right side of the gate stack structure 206 is removed. The method of removing the control gate material layer 218 includes, for example, forming a patterned mask layer that exposes the control gate material layer 218 outside the gate stack structure 204 and the gate stack structure 206 on the substrate 200, and then performing an etching process to move the exposed control gate material layer 218. In the present embodiment, the control gate material layer 218 remaining between the gate stack structure 204 and the gate stack structure 206 forms a control gate 220 in the memory structure of the present invention.

Figure 2F:
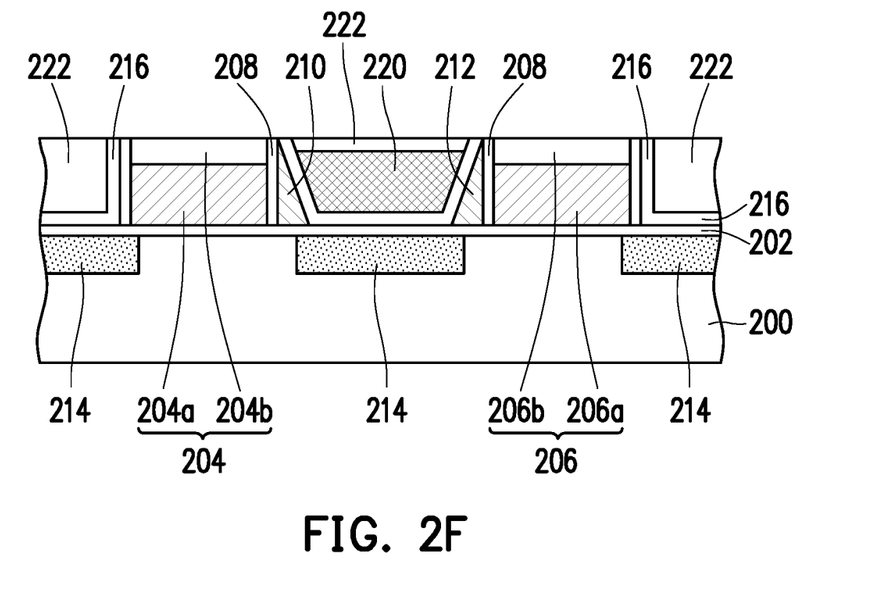

Next, referring to FIG. 2F, a dielectric layer 222 is formed to cover the dielectric layer 216 and the control gate 220. The material of the dielectric layer 222 is, for example, silicon oxide. The dielectric layer 222 is formed by, for example, forming a dielectric material layer on the dielectric layer 216, wherein the dielectric material layer fills the space between the gate stack structure 204 and the gate stack structure 206. Then, a planarization process, e.g., a chemical mechanical polishing process (CMP), is performed to remove a portion of the dielectric material layer, a portion of the dielectric layer 216 and a portion of the dielectric layer 208, until the dielectric layer 204b and the dielectric layer 206b are exposed.

Figure 2G:
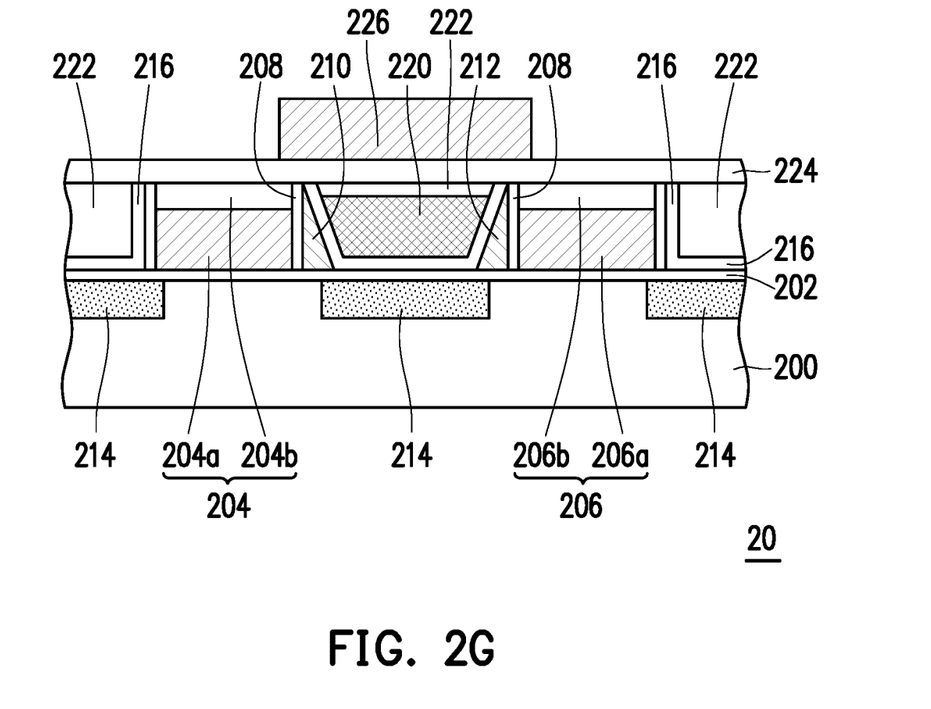

Thereafter, referring to FIG. 2G, a dielectric layer 224 is formed on the dielectric layer 222. The material of the dielectric layer 224 is, for example, silicon oxide. Since the planarization process has been performed to the dielectric layer 222 in the step illustrated in FIG. 2F, the dielectric layer 224 may be formed on a flat surface, and thus the dielectric layer 224 may also have a flat surface. Thereafter, an erase gate 226 is formed on the dielectric layer 224, and the erase gate 226 is located above the spacer 210, the spacer 212 and the control gate 220. The erase gate 226 is formed by, for example, forming an erase gate material layer on the dielectric layer 224 and then performing a patterning process. In particular, the formed erase gate 226 has to be located at least above the spacer 210, the spacer 212 and the control gate 220. That is, the erase gate 226 is at least overlapped with the spacer 210 and the spacer 212 as floating gates and the control gate 220. In the present embodiment, the formed erase gate 226 extends to a region on the dielectric layer 204b and the dielectric layer 206b to ensure that the erase gate 226 can be overlapped with the spacer 210 and the spacer 212 as floating gates. In this way, the manufacture of the memory structure 20 of the present embodiment is completed.

The memory structure of the present invention will be further described below with the memory structure 20 of FIG. 2G.

Referring to FIG. 2G, in the memory structure 20, the gate stack structure 204 and the gate stack structure 206 are disposed on the dielectric layer 202 and are separated from each other. The gate stack structure 204 includes a word line 204a and a dielectric layer 204b which are sequentially stacked on the substrate 200, and the gate stack structure 206 includes a word line 206a and a dielectric layer 206b which are sequentially stacked on the substrate 200. The spacer 210 and the spacer 212 as the floating gates are disposed between the gate stack structure 204 and the gate stack structure 206, and the top surfaces of the spacer 210 and the spacer 212 are not higher than the top surfaces of the dielectric layer 204b and the dielectric layer 206b. The control gate 220 is disposed between the spacer 210 and the spacer 212. The erase gate 226 is disposed above the spacer 210, the spacer 212 and the control gate 220, and is overlapped with the spacer 210, the spacer 212 and the control gate 220.

Therefore, the memory structure 20 can have a pair of memory cells. The memory cell on the left side includes a gate stack structure 204, a dielectric layer 208, a spacer 210 as a floating gate, a doped region 214 beside the gate stack structure 204, a dielectric layer 216, a control gate 220, and an erase gate 226. The memory cell on the right side includes a gate stack structure 206, a dielectric layer 208, a spacer 212 as a floating gate, a doped region 214 beside the gate stack structure 206, a dielectric layer 216, a control gate 220 and an erase gate 226. The memory cell on the left side and the memory cell on the right side share the control gate 220, the erase gate 226 and the doped region 214 between the two memory cells, so that the size of the memory structure can be effectively reduced, and the two memory cells can be separately operated according to actual needs.

In each memory cell, the floating gate has a spacer form (spacer 210 and spacer 212), the top surface of the floating gate is not higher than the top surface of the dielectric layer 204b (or the dielectric layer 206b) and is higher than the bottom surface of the dielectric layer 204b (or the dielectric layer 206b), and the erase gate 226 is located above the floating gate, so that during the erasing operation of the memory cell, the electrons can be rapidly move from the top (vertex) of the floating gate to the erase gate, so it can effectively improve the erasing speed. In addition, the top surface of the control gate 220 is lower than the top surface of the floating gate, thereby avoiding a breakdown between the control gate and the erase gate during the erasing operation of the memory cell.

The method of operating the memory structure of the present invention will be briefly described below.

In one embodiment, when the memory structure 20 of the present invention is programmed, a voltage of 0.6 V is applied to the word line 204a and the word line 206a, and a voltage of 8 V is applied to the control gate 220, a voltage of 4 V is applied to the doped region 214 as a source, a voltage of 4 V is applied to the erase gate 226, and zero voltage is applied to the doped region 214 as a drain and the substrate 200. At this time, electrons are injected from the drain to the floating gate for source-side injection.

In an embodiment, when the memory structure 20 of the present invention is erased, a voltage of −8 V is applied to the control gate 220, the doped region 214 as a source and a drain is floated, a voltage of 8 V is applied to the erase gate 226, and zero voltage is applied to the word line 204a, the word line 206a and the substrate 200. At this point, electrons move rapidly from the top surface (vertex) of the floating gate to the erase gate 226 for F-N tunneling.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory structure, comprising:
   a first dielectric layer, disposed on a substrate;
   a pair of gate stack structures, disposed on the first dielectric layer and separated from each other, wherein each of the gate stack structures comprises:
   a word line, disposed on the substrate;
   an erase gate, disposed on the word line; and
   a second dielectric layer, disposed between the word line and the erase gate;
   a third dielectric layer, disposed on a surface of each of the gate stack structures;
   a pair of floating gates, disposed between the gate stack structures, wherein each of the floating gates is located on the third dielectric layer on a sidewall of the corresponding gate stack structure, and top surfaces of the floating gates are lower than top surfaces of the erase gates;
   a fourth dielectric layer, covering the first dielectric layer, the third dielectric layer and the floating gates;
   a control gate, disposed on the fourth dielectric layer between the floating gates;
   a doped region, disposed in the substrate beside each of the gate stack structures.

2. The memory structure of claim 1, wherein the top surface of each of the floating gates is higher than a bottom surface of each of the erase gates.

3. The memory structure of claim 1, wherein a top surface of the control gate is lower than the top surface of each of the floating gates.

4. The memory structure of claim 1, wherein the doped region between the floating gates is located under the control gate.

5. The memory structure of claim 1, wherein each of the floating gates has a spacer form.

6. A manufacturing method of a memory structure, comprising:
   forming a first dielectric layer on a substrate;
   forming a pair of separate gate stack structures on the first dielectric layer, wherein each of the gate stack structures comprises:
   a word line, located on the substrate;
   an erase gate, located on the word line; and
   a second dielectric layer, located between the word line and the erase gate;
   forming a third dielectric layer on a surface of each of the gate stack structures;
   forming a pair of floating gates between the gate stack structures, wherein each of the floating gates is located on the third dielectric layer on a sidewall of the corresponding gate stack structure, and a top surface of each of the floating gates is lower than a top surface of each of the erase gates;
   forming a doped region in the substrate beside each of the gate stack structures;

forming a fourth dielectric layer on the substrate, wherein the fourth dielectric layer covers the first dielectric layer, the third dielectric layer and the floating gates; and forming a control gate on the fourth dielectric layer between the floating gates.

7. The manufacturing method of claim 6, wherein the top surface of each of the floating gates is higher than a bottom surface of each of the erase gates.

8. The manufacturing method of claim 6, wherein a top surface of the control gate is lower than the top surface of each of the floating gate.

9. The manufacturing method of claim 6, wherein a method of forming the pair of floating gates comprises:

forming a floating gate material layer conformally on the substrate, wherein the floating gate material layer covers the gate stack structures;

performing an anisotropic etching process to remove a portion of the floating gate material layer and therefore form spacers, until top surfaces of the spacers are lower than top surfaces of the erase gates; and removing the spacers outside the pair of gate stack structures.

10. The manufacturing method of claim 6, wherein a method of forming the control gate comprises:

forming a control gate material layer on the fourth dielectric layer, wherein the control gate material layer fills a space between the gate stack structures;

performing an etch back process to remove a portion of the control gate material layer; and removing the control gate material layer outside the pair of gate stack structures.

* * * * *